United States Patent
Koo et al.

(10) Patent No.: US 9,472,650 B2
(45) Date of Patent: Oct. 18, 2016

(54) MANUFACTURING METHOD OF FLEXIBLE DISPLAY DEVICE

(71) Applicant: SAMSUNG DISPLAY CO., LTD., Yongin, Gyeonggi-Do (KR)

(72) Inventors: Hyun Woo Koo, Hwaseong-si (KR); Ki Hyun Kim, Daegu (KR); Sun Ho Kim, Seongnam-si (KR); Jeong ho Kim, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/810,910

(22) Filed: Jul. 28, 2015

(65) Prior Publication Data
US 2016/0211350 A1 Jul. 21, 2016

(30) Foreign Application Priority Data

Jan. 21, 2015 (KR) .................. 10-2015-0010124

(51) Int. Cl.
*H01L 29/66* (2006.01)
*H01L 21/02* (2006.01)
*H01L 27/12* (2006.01)
*H01L 51/00* (2006.01)
*H01L 27/32* (2006.01)
*H01L 21/322* (2006.01)
*H01L 21/00* (2006.01)

(52) U.S. Cl.
CPC ..... *H01L 29/66757* (2013.01); *H01L 21/0217* (2013.01); *H01L 21/02422* (2013.01); *H01L 21/02532* (2013.01); *H01L 21/02592* (2013.01); *H01L 21/02628* (2013.01); *H01L 21/3226* (2013.01); *H01L 27/1218* (2013.01); *H01L 27/1259* (2013.01); *H01L 27/3244* (2013.01); *H01L 51/0096* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 6,150,239 A | * | 11/2000 | Goesele | H01L 21/76251 117/915 |
| 6,352,909 B1 | * | 3/2002 | Usenko | H01L 21/2236 257/E21.143 |
| 6,468,923 B1 | * | 10/2002 | Yonehara | C25D 11/32 257/E21.102 |
| 6,696,352 B1 | * | 2/2004 | Carr | B81C 1/00357 257/E21.568 |
| 7,456,059 B2 | | 11/2008 | Kodaira et al. | |

(Continued)

FOREIGN PATENT DOCUMENTS

| | | |
|---|---|---|
| JP | 2010-010411 A | 1/2010 |
| KR | 10-0499998 B1 | 7/2005 |

(Continued)

OTHER PUBLICATIONS

Pankove, et al., Photoluminescence of Hydrogenated Amorphous Silicon, Appl. Phys. Lett. 1977, 31, 450-451.

(Continued)

*Primary Examiner* — Evren Seven
(74) *Attorney, Agent, or Firm* — Lee & Morse, P.C.

(57) ABSTRACT

A method of manufacturing a flexible display device, the method including forming a sacrificial layer on a carrier substrate such that the sacrificial layer includes a hydrogen trap material and amorphous silicon; forming a support layer and a thin film transistor on the sacrificial layer; and separating the support layer from the carrier substrate by irradiating a laser to the sacrificial layer.

15 Claims, 10 Drawing Sheets

(56) References Cited

U.S. PATENT DOCUMENTS

| | | | | |
|---|---|---|---|---|
| 2005/0128843 | A1* | 6/2005 | Kajimoto | H01L 27/115 365/205 |
| 2008/0124915 | A1* | 5/2008 | Yamaguchi | H01L 21/76843 438/637 |
| 2009/0092810 | A1* | 4/2009 | Lee | H01L 21/3226 428/220 |
| 2009/0166878 | A1* | 7/2009 | Seok | H01L 21/02164 257/773 |
| 2010/0087014 | A1* | 4/2010 | Nagai | H01L 21/67017 438/3 |
| 2010/0151627 | A1* | 6/2010 | Kim | H01L 27/1214 438/113 |
| 2010/0224883 | A1* | 9/2010 | Park | H01L 21/02422 257/72 |
| 2011/0059561 | A1* | 3/2011 | Liao | H01L 27/1214 438/34 |
| 2011/0084391 | A1* | 4/2011 | Cheng | H01L 24/03 257/751 |
| 2012/0212149 | A1* | 8/2012 | Forster | H05B 37/0272 315/246 |
| 2013/0316487 | A1* | 11/2013 | de Graff | H01L 27/14683 438/66 |
| 2014/0034116 | A1* | 2/2014 | Zuppero | G21H 1/12 136/253 |

FOREIGN PATENT DOCUMENTS

| | | |
|---|---|---|
| KR | 10-2012-0100274 A | 9/2012 |
| KR | 10-2013-0006993 A | 1/2013 |

OTHER PUBLICATIONS

Inoue, et al., Transfer Mechanism in Surface Free Technology by Laser Annealing/Ablation (SUFTLA), SID 03 Digest p. 984-987.

\* cited by examiner

FIG. 1
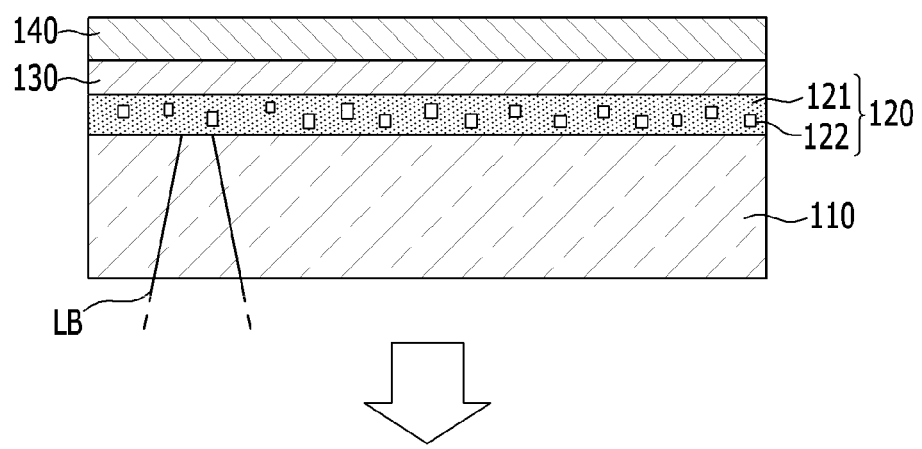
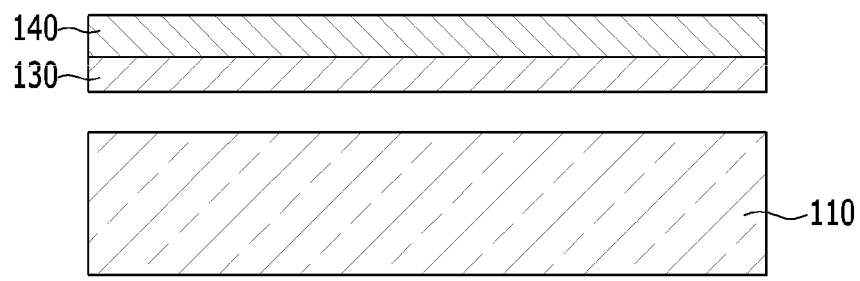

MANUFACTURING METHOD OF FLEXIBLE DISPLAY DEVICE

CROSS-REFERENCE TO RELATED APPLICATION

Korean Patent Application No. 10-2015-0010124, filed on Jan. 21, 2015, in the Korean Intellectual Property Office, and entitled: "Manufacturing Method of Flexible Display Device," is incorporated by reference herein in its entirety.

BACKGROUND

1. Field

Embodiments relate to a manufacturing method of a flexible display device.

2. Description of the Related Art

A flat panel display may include a liquid crystal display and an organic light emitting device and may be gradually slimmed. Recently, a bendable or foldable flexible display device has been actively researched and developed.

The above information disclosed in this Background section is only for enhancement of understanding of the background of the described technology and therefore it may contain information that does not form the prior art that is already known in this country to a person of ordinary skill in the art.

SUMMARY

Embodiments are directed to a manufacturing method of a flexible display device.

The embodiments may be realized by providing a method of manufacturing a flexible display device, the method including forming a sacrificial layer on a carrier substrate such that the sacrificial layer includes a hydrogen trap material and amorphous silicon; forming a support layer and a thin film transistor on the sacrificial layer; and separating the support layer from the carrier substrate by irradiating a laser to the sacrificial layer.

The hydrogen trap material may include a metal that adsorbs hydrogen to form a metal-hydrogen complex or a metal-hydride.

The hydrogen trap material may include at least one of platinum (Pt), titanium (Ti), or palladium (Pd).

The hydrogen trap material may adsorb hydrogen separated from the amorphous silicon during forming of the thin film transistor, and the hydrogen adsorbed onto the hydrogen trap material may be separated from the hydrogen trap material during irradiating of the laser to the sacrificial layer.

Forming the sacrificial layer may include depositing the amorphous silicon on the carrier substrate, and diffusing the hydrogen trap material into the amorphous silicon by high-temperature heat treatment.

The method may further include forming a silicon nitride (SiNx) layer on at least one surface of the sacrificial layer.

Forming the sacrificial layer may include dispersing nanoparticles made of the hydrogen trap material in an amorphous silicon solution, and printing the amorphous silicon solution that includes the dispersed nanoparticles on the carrier substrate.

The method may further include forming a silicon nitride (SiNx) layer on at least one surface of the sacrificial layer.

The sacrificial layer may include a first layer and a second layer, and the hydrogen trap material may be included in the first layer.

The first layer may be formed by a method of printing an amorphous silicon solution, in which nanoparticles made of the hydrogen trap material are dispersed, onto the carrier substrate, and the second layer may be formed by a method of depositing the amorphous silicon.

Forming the sacrificial layer may include coating nanoparticles made of the hydrogen trap material onto the carrier substrate, and depositing the amorphous silicon onto the nanoparticles.

Forming the sacrificial layer may include forming a first layer including the amorphous silicon, and forming a second layer on the first layer such that the second layer includes the hydrogen trap material and an insulating material.

The amorphous silicon of the first layer may be formed by deposition, and the second layer may be formed by a process of printing nanoparticles made of the hydrogen trap material and then applying the insulating material onto the nanoparticles.

The insulating material may include at least one of a silicon oxide ($SiO_2$) layer or a silicon nitride (SiNx) layer.

The support layer may be a flexible substrate.

The support layer may be a barrier layer, and the method may further include bonding a flexible substrate to the support layer after the support layer is separated from the carrier substrate.

BRIEF DESCRIPTION OF THE DRAWINGS

Features will be apparent to those of skill in the art by describing in detail exemplary embodiments with reference to the attached drawings in which:

FIG. 1 illustrates a schematic cross-sectional view of stages in a method of manufacturing a flexible display device according to a first exemplary embodiment.

DETAILED DESCRIPTION

Figure 2:
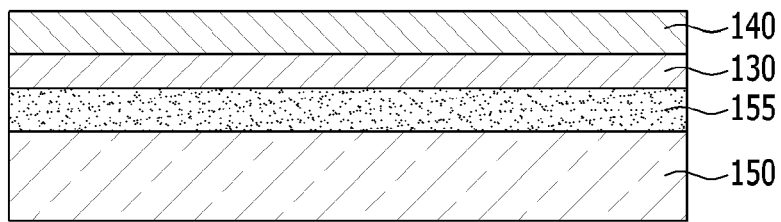
FIG. 2 illustrates a schematic cross-sectional view of a modified embodiment of the flexible display device of FIG. 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the specification, it will be understood that when an element such as a layer, film, region, or substrate is referred to as being "on" another element, it can be directly on the other element or intervening elements may also be present. Further, the word "on" means positioning on or below the object portion, but does not essentially mean positioning on the upper side of the object portion based on a gravity direction.

In the specification, unless explicitly described to the contrary, the word "comprise" and variations such as "includes," "comprises," or "comprising", will be understood to imply the inclusion of stated elements but not the exclusion of any other elements.

FIG. 1 illustrates a schematic cross-sectional view of stages in a method of manufacturing a flexible display device according to a first exemplary embodiment.

Referring to FIG. 1, a method of manufacturing a flexible display device according to a first exemplary embodiment may include a first step of preparing a carrier substrate 110, a second step of forming a sacrificial layer 120 on the carrier substrate 110, a third step of forming a support layer 130 and a thin film transistor 140 on the sacrificial layer 120, and a fourth step of separating the support layer 130 from the carrier substrate 110 by irradiating laser to the sacrificial layer 120.

In the first step, the carrier substrate 110 may be formed of a material that transmits laser light, is hard, and has high heat resistance, e.g., quartz glass or heat-resistant glass. The heat resistance temperature of the carrier substrate 110 may be higher than a highest temperature experienced during a process of manufacturing the thin film transistor 140. The laser transmittance of the carrier substrate 110 may be, e.g., 50% or more, to thereby minimize energy loss of the laser in the fourth step.

In the second step, the sacrificial layer 120 may be formed to include amorphous silicon 121 and a hydrogen trap material 122. The hydrogen trap material 122 may trap, adsorb, or otherwise combine with hydrogen separated from the amorphous silicon 121 during a high temperature process (e.g., 450° C. or higher) of forming the thin film transistor 140.

The hydrogen trap material 122 may adsorb hydrogen to generate, e.g., a metal-hydrogen complex (metal-H complex), a metal-hydride, or the like. The hydrogen trap material 122 may be made of or may include, e.g., a metal material having excellent thermal stability at high temperatures of 450° C. or higher. In an implementation, the hydrogen trap material 122 may include, e.g., platinum (Pt), titanium (Ti), and/or palladium (Pd).

The amorphous silicon 121 may be formed on the carrier substrate 110 by, e.g., chemical vapor deposition (CVD). The hydrogen trap materials 122 may be diffused into the amorphous silicon 121 at high temperatures, e.g., of about 1,220° C. or higher, to be evenly distributed in the amorphous silicon 121.

For example, the second step may include a process of depositing the amorphous silicon 121 on the carrier substrate 110, forming a layer made of platinum, titanium, or palladium on the surface of the amorphous silicon 121, and diffusing the platinum, titanium, or palladium on or from the surface of the amorphous silicon 121 into the amorphous silicon 121 by a high-temperature heat treatment.

In the third step, the support layer 130 may be or include a flexible substrate, and manufacturing of the thin film transistor 140 may include, e.g., dehydrogenation and a high temperature process at 450° C. or higher (such as a heat treatment of an active layer). In an implementation, a barrier layer including, e.g., a silicon nitride (SiNx) layer and/or a silicon oxide ($SiO_2$) layer, may be formed between the flexible substrate and the thin film transistor 140.

The flexible substrate may be formed of a material having high heat resistance, e.g., metal, quartz glass, or heat-resistant glass, and may have a small thickness of, e.g., 500 µm or less, so as to be easily bent by an external force.

In an implementation, the support layer 130 may be or include a barrier layer including, e.g., a silicon nitride (SiNx) layer and/or a silicon oxide ($SiO_2$) layer. FIG. 2 illustrates a schematic cross-sectional view of a modified embodiment of the flexible display device illustrated in FIG. 1.

Referring to FIG. 2, the method of manufacturing a flexible display device may further include a fifth step of attaching the flexible substrate 150 to the support layer 130 after performing the fourth step. In this case, the flexible substrate 150 may be, e.g., a plastic film, and may be attached to the support layer 130 by an adhesive layer 155.

The flexible substrate 150 formed of the plastic film may be more flexible than a flexible substrate formed of metal, quartz glass, heat-resistant glass, or the like and may thus be easily bendable or foldable, but may have slightly lower heat resistance. When the flexible substrate 150 is attached to the support layer 130 after forming the thin film transistor 140 on the support layer 130, the process temperature of the thin film transistor 140 may not be limited, e.g., may not need to be selected or adjusted in view of the heat resistance of the later-provided flexible substrate 150 material.

For example, if the thin film transistor 140 were to be formed directly on the flexible substrate 150 formed of the plastic film, the process temperature of the thin film transistor 140 may be limited due to a low heat resistance temperature of the plastic film. However, when the flexible substrate 150 is attached below the support layer 130 on which the thin film transistor 140 has already been formed, it may not be necessary to consider the heat resistance temperature of the plastic film at the time of forming the thin film transistor 140.

Referring back to FIG. 1, in the fourth step, the laser LB may be transmitted through the carrier substrate 110 to be irradiated to the sacrificial layer 120. The hydrogen-containing amorphous silicon 121 of the sacrificial layer 120 may undergo a phase transition to polysilicon in response to energy from the laser LB, and simultaneously, a large amount of hydrogen gas may be discharged from the amorphous silicon 121.

For example, the laser LB may decompose a bond of the amorphous silicon 121 and hydrogen to cause a hydrogen explosion, and the amorphous silicon 121 may be removed by laser ablation, thereby separating the support layer 130 from the carrier substrate 110.

The source of the laser LB used in the fourth step may include, e.g., an excimer laser having a wavelength of 308 nm, a Yb:YAG laser having a wavelength of 343 nm, a Nd:YAG laser having a wavelength of 355 nm, and/or a green laser having a wavelength of 532 nm. The excimer laser may output high energy of short-wavelengths without damaging the carrier substrate 110, the support layer 130, and the thin film transistor 140, thereby removing the sacrificial layer 120 within a short time.

In the fourth step, in order to help ensure the separation of the support layer 130 from the carrier substrate 110, a reduction in the hydrogen concentration of the sacrificial layer 120 should be prevented before performing the fourth step. If the hydrogen concentration of the sacrificial layer 120 were to be reduced before performing the fourth step, the hydrogen explosion of the sacrificial layer 120 may not occur in the fourth step, and thus the support layer 130 may not be properly separated from the carrier substrate 110.

If the sacrificial layer were to include only the amorphous silicon 121 (e.g., without the hydrogen trap material 122), as the thin film transistor 140 is subjected to dehydrogenation and a high temperature process at 450° C. or higher (such as heat treatment of an active layer), hydrogen could be prematurely separated from the amorphous silicon 121, thereby reducing the hydrogen concentration of the sacrificial layer. In the amorphous silicon 121, the dehydrogenation may begin to proceed at 350° C. or higher, and 98% or more of the total hydrogen content may be removed by the time the temperature reaches 450° C. or higher.

In the manufacturing method according to the first exemplary embodiment, when the hydrogen is separated from the amorphous silicon 121 of the sacrificial layer 120 (during the high temperature process of forming the thin film transistor 140), the hydrogen trap material 122 may trap or adsorb the hydrogen. The hydrogen trap material 122 may combine with the hydrogen to form, e.g., a metal-H complex (such as a platinum-hydrogen complex) or a metal-hydride.

The hydrogen adsorbed onto the hydrogen trap material 122 may be separated or released from the hydrogen trap material 122 by the high energy of the laser LB in the fourth step of irradiating the laser LB to the sacrificial layer 120, thereby causing a hydrogen explosion or decomposition of the sacrificial layer 120. For example, the sacrificial layer 120 (including the hydrogen trap material 122) may maintain the constant hydrogen concentration, even during the high-temperature heat treatment process of the third step, and may help ensure the separation of the support layer 130 from the carrier substrate 110 occurs in the fourth step, thereby preventing a process defect.

Figure 3:
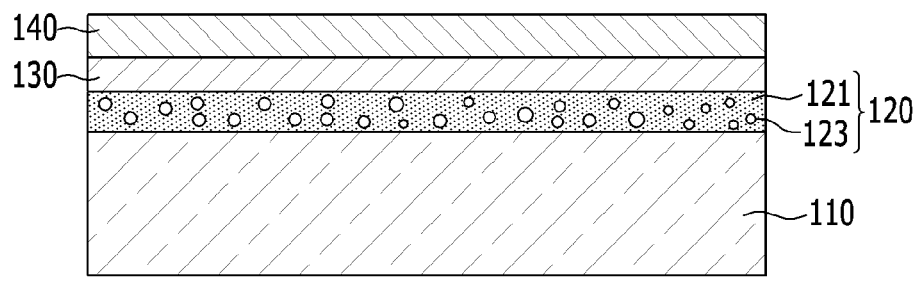
FIG. 3 illustrates a schematic cross-sectional view of a stage in a method of manufacturing a flexible display device according to a second exemplary embodiment.

FIG. 3 illustrates a schematic cross-sectional view of a stage in a method of manufacturing a flexible display device according to a second exemplary embodiment.

Referring to FIG. 3, in the method of manufacturing a flexible display device according to the second exemplary embodiment, a second step may include a process of uniformly dispersing nanoparticles 123 (made of a hydrogen trap material) in solution type amorphous silicon 121 and printing the solution type amorphous silicon 121 onto the carrier substrate 110, thus forming a sacrificial layer 120. For example, the amorphous silicon may be dissolved to form an amorphous silicon solution, the nanoparticles 123 may be dispersed in the amorphous silicon solution, and the solution (including the dispersed nanoparticles 123) may be printed onto the carrier substrate 110 to form the sacrificial layer 120.

The nanoparticle 123 may include at least one of, e.g., platinum, titanium, or palladium, and may adsorb hydrogen separated from the amorphous silicon 121 during the high temperature process of forming the thin film transistor 140. When the hydrogen bonded to the nanoparticle 123 is separated from the nanoparticle 123 by high energy of laser at the time of irradiating laser to the sacrificial layer 120, a hydrogen explosion may occur.

The printing (of an amorphous silicon solution) may be simpler than chemical vapor deposition (of amorphous silicon) in terms of a process and machine equipment, and the condition of the printing process may not be stringent, such that in the manufacturing method of the second exemplary embodiment, it is possible to simplify the manufacture of the sacrificial layer 120 and reduce process costs, compared to the manufacturing method of the first exemplary embodiment. The other steps (except for the second step of the manufacturing method of the second exemplary embodiment) may be the same as those of the first exemplary embodiment or the modified embodiment of the first exemplary embodiment.

Figure 4:
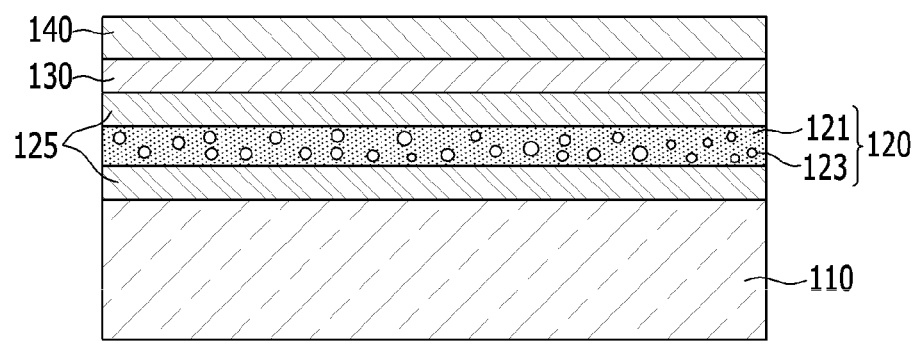
FIG. 4 illustrates a schematic cross-sectional view of a stage in a method of manufacturing a flexible display device according to a third exemplary embodiment.

FIG. 4 illustrates a schematic cross-sectional view of a stage in a method of manufacturing a flexible display device according to a third exemplary embodiment.

Referring to FIG. 4, in the method of manufacturing a flexible display device according to the third exemplary embodiment, the second step may further include a process of forming silicon nitride (SiNx) layers 125 either on or below, or both on and below, the sacrificial layer 120. FIG. 4 illustrates a case in which the silicon nitride layers 125 are formed both on and below the sacrificial layer 120, as an example. The silicon nitride layer 125 formed below the sacrificial layer 120 may be in contact with the carrier substrate 110 and/or the silicon nitride layer 125 formed on the sacrificial layer 120 may be in contact with the support layer 130.

Amorphous silicon 121 of the sacrificial layer 120 may be formed by chemical vapor deposition and hydrogen trap materials may be evenly distributed in the amorphous silicon 121 by diffusion. In an implementation, the sacrificial layer 120 may be formed by a method of uniformly dispersing nanoparticles 123 (made of a hydrogen trap material) in an amorphous silicon 121 solution, and printing the amorphous silicon 121 solution on the carrier substrate 110. FIG. 4 illustrates the second case as an example.

The silicon nitride layer 125 may be formed by chemical vapor deposition and may be rich in hydrogen. The silicon nitride layer 125 may allow the sacrificial layer 120 to stably maintain the desired hydrogen concentration by supplying hydrogen to the sacrificial layer 120 during the high temperature process of forming the thin film transistor 140. The other steps (except for the second step of the manufacturing method of the third exemplary embodiment) may be the same as those of the first exemplary embodiment or the modified embodiment of the first exemplary embodiment.

Figure 5:
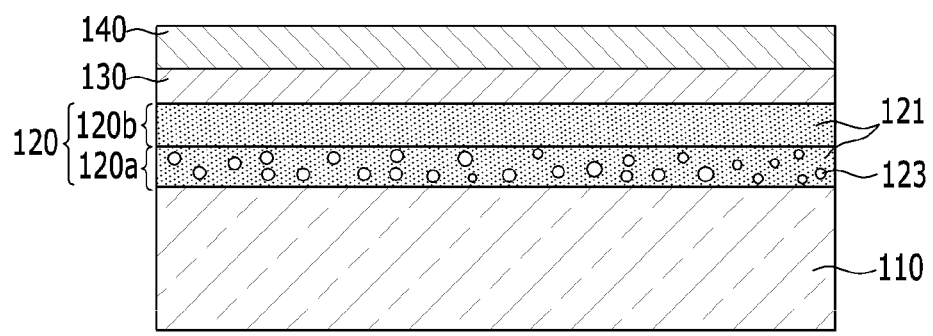
FIG. 5 illustrates a schematic cross-sectional view of a stage in a method of manufacturing a flexible display device according to a fourth exemplary embodiment.

FIG. 5 illustrates a schematic cross-sectional view of a stage in a method of manufacturing a flexible display device according to a fourth exemplary embodiment.

Referring to FIG. 5, in the method of manufacturing a flexible display device according to the fourth exemplary embodiment, the second step may include a process of forming a first layer 120*a* (including a hydrogen trap material and amorphous silicon 121), and forming a second layer 120*b* (including amorphous silicon 121) on the first layer 120*a*. The sacrificial layer 120 may have a structure in which the first layer 120*a* and the second layer 120*b* are stacked.

The first layer 120*a* may be formed by a method of uniformly dispersing nanoparticles 123 (made of or including a hydrogen trap material) in an amorphous silicon 121 solution and printing the solution onto the carrier substrate 110. In an implementation, the amorphous silicon 121 of the second layer 120*b* may be formed by chemical vapor deposition.

The second layer 120*b* may be rich in hydrogen, and thus may supply hydrogen to the first layer 120*a* during the high temperature process of forming the thin film transistor 140, thereby allowing the first layer 120a to stably maintain a desired hydrogen concentration. The other steps (except for the second step of the manufacturing method of the fourth exemplary embodiment) may be the same as those of the first exemplary embodiment or the modified embodiment of the first exemplary embodiment.

Figure 6:
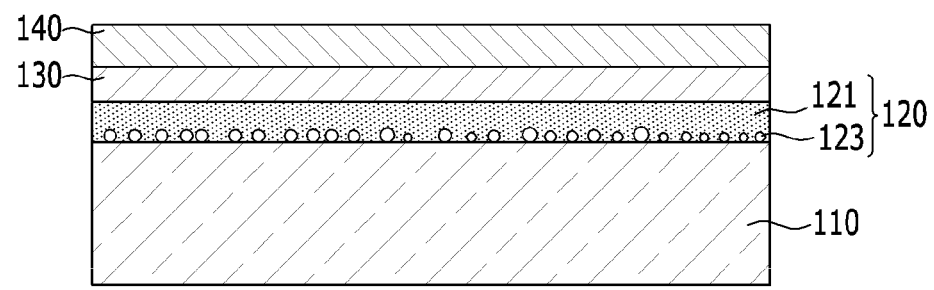
FIG. 6 illustrates a schematic cross-sectional view of a stage in a method of manufacturing a flexible display device according to a fifth exemplary embodiment.

FIG. 6 illustrates a schematic cross-sectional view of a stage in a method of manufacturing a flexible display device according to a fifth exemplary embodiment.

Referring to FIG. 6, in the method of manufacturing a flexible display device according to the fifth exemplary embodiment, the second step may include a process of coating nanoparticles 123 (made of or including a hydrogen trap material) on the carrier substrate 110, and depositing amorphous silicon 121 on the carrier substrate 110 coated with the nanoparticles 123. In an implementation, the nanoparticles 123 may be coated on the carrier substrate 110 by a printing method.

The sacrificial layer 120 may be divided into or include, e.g., a nanoparticle layer coated on the carrier substrate 110, and an amorphous silicon layer covering the nanoparticle layer. The other steps (except for the second step of the manufacturing method of the fifth exemplary embodiment) may be the same as those of the first exemplary embodiment or the modified embodiment of the first exemplary embodiment.

Figure 7:
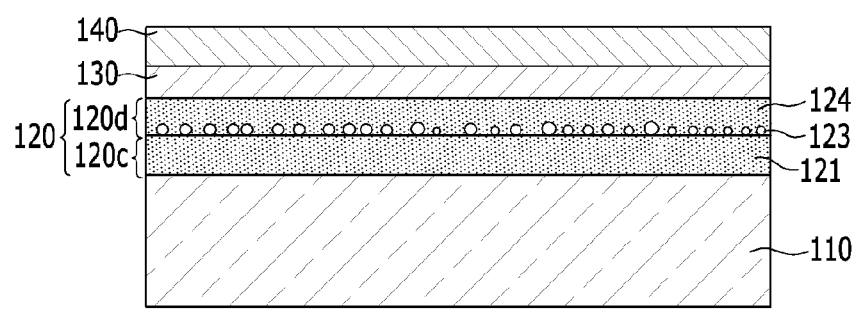
FIG. 7 illustrates a schematic cross-sectional view of a stage in a method of manufacturing a flexible display device according to a sixth exemplary embodiment.

FIG. 7 illustrates a schematic cross-sectional view of a stage in a method of manufacturing a flexible display device according to a sixth exemplary embodiment.

Referring to FIG. 7, in the method of manufacturing a flexible display device according to the sixth exemplary embodiment, the second step may include a process of forming a first layer 120c (that includes amorphous silicon 121) and forming a second layer 120d (that includes a hydrogen trap material and an insulating material 124) on the first layer 120c.

The amorphous silicon 121 of the first layer 120c may be formed by, e.g., chemical vapor deposition. The second layer 120d may be formed by a process of applying nanoparticles 123 (made of or including a hydrogen trap material) on the first layer 120c by a printing method, and then applying the insulating material 124 on the nanoparticles 123.

The insulating material 124 may include, e.g., at least one of silicon oxide ($SiO_2$) or silicon nitride (SiNx), or a silicon oxide layer and/or a silicon nitride layer may be stacked on the nanoparticles 123. The insulating material 124 (including silicon nitride) may supply hydrogen to the first layer 120c during the high temperature process of forming the thin film transistor 140, thereby allowing the first layer 120c to stably maintain a desired hydrogen concentration.

The nanoparticles 123 in the sacrificial layer 120 may form a different layer from the amorphous silicon 121, and may be in contact with, e.g., in direct contact with, the amorphous silicon 121, thereby directly adsorbing the hydrogen separated from the amorphous silicon 121 during the high temperature process of forming the thin film transistor 140.

The other steps (except for the second step of the manufacturing method of the sixth exemplary embodiment) may be the same as those of the first exemplary embodiment or the modified embodiment of the first exemplary embodiment.

Figure 8:
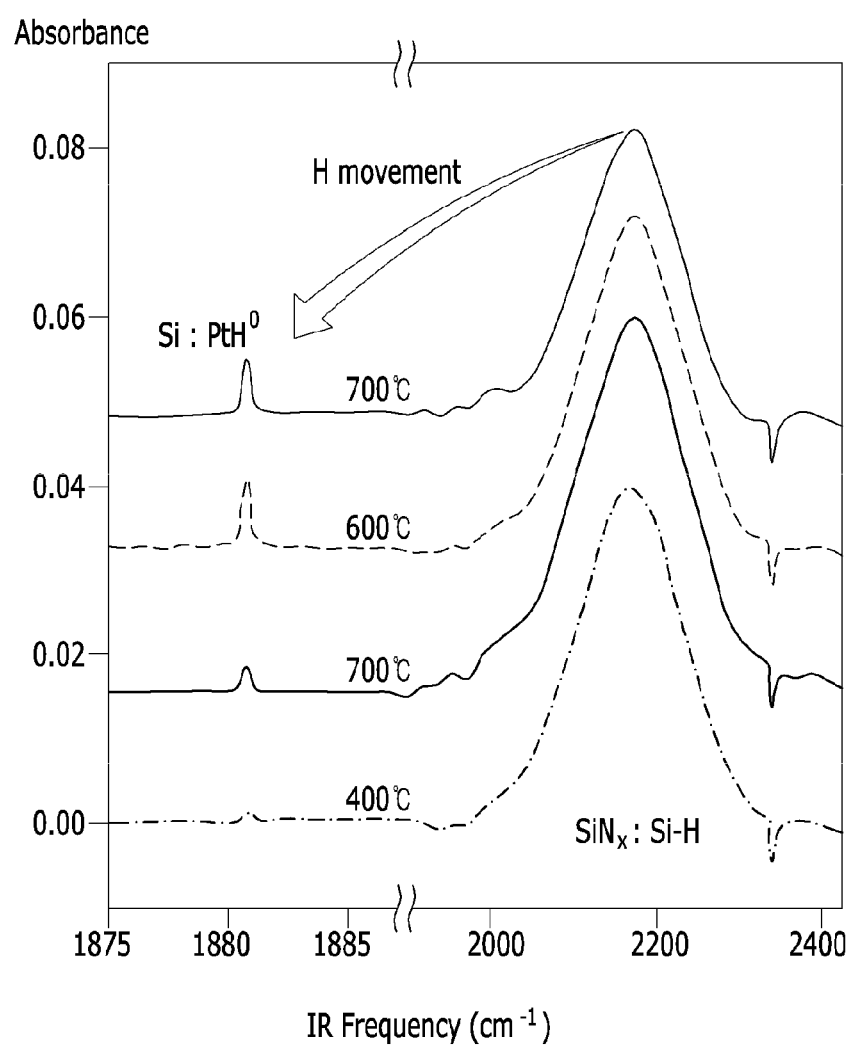
FIG. 8 illustrates a graph showing a hydrogen trap effect of a sacrificial layer in the method of manufacturing a flexible display device according to the third exemplary embodiment.

FIG. 8 illustrates a graph showing a hydrogen trap effect of a sacrificial layer in the method of manufacturing a flexible display device according to the third exemplary embodiment. A horizontal axis of the graph represents an infrared frequency and a vertical axis represents absorbance.

The sacrificial layer used in an experiment may include amorphous silicon and a hydrogen trap material made of platinum, and a silicon nitride layer may be positioned on the sacrificial layer. The sacrificial layer and the silicon nitride layer may be subjected to heat treatment for 10 minutes under conditions of 400° C., 500° C., 600° C., and 700° C. An absorbance peak on the right of the graph represents a hydrogen concentration of the silicon nitride layer and an absorbance peak on the left of the graph represents a concentration of hydrogen adsorbed onto platinum.

Referring to FIG. 8, it may be be seen from the absorbance peak on the left of the graph that hydrogen of the silicon nitride layer may move to the sacrificial layer and may be adsorbed onto platinum in the sacrificial layer. The platinum may combine with hydrogen to generate a platinum-hydrogen complex. Accordingly, the sacrificial layer may maintain the desired hydrogen concentration even during the high temperature process of forming the thin film transistor, and may help ensure that the support layer is separable from the carrier substrate in the fourth step.

Figure 9:
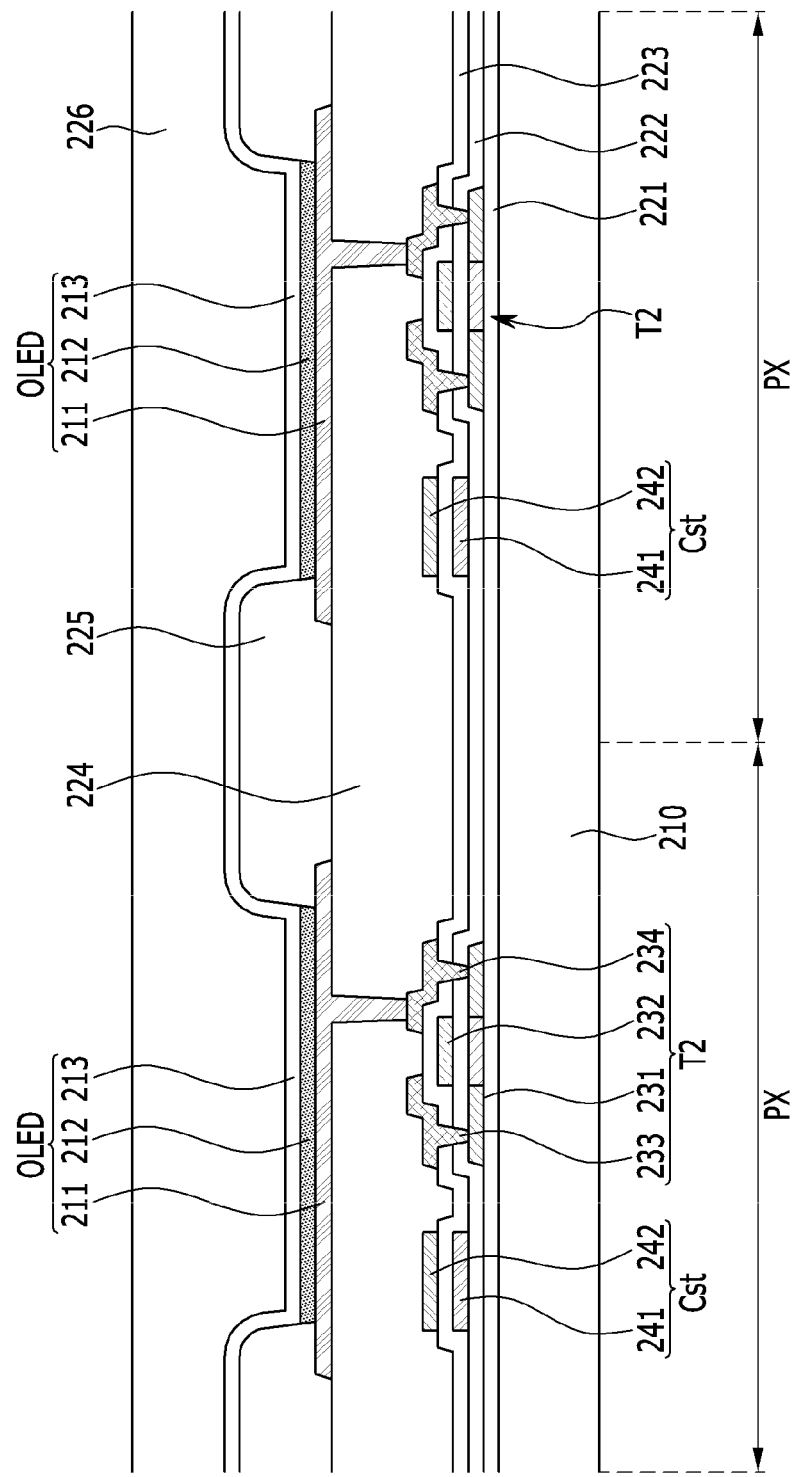
FIG. 9 illustrates a partially enlarged view of an example of the flexible display device manufactured by the method according to the exemplary embodiment.
Figure 10:
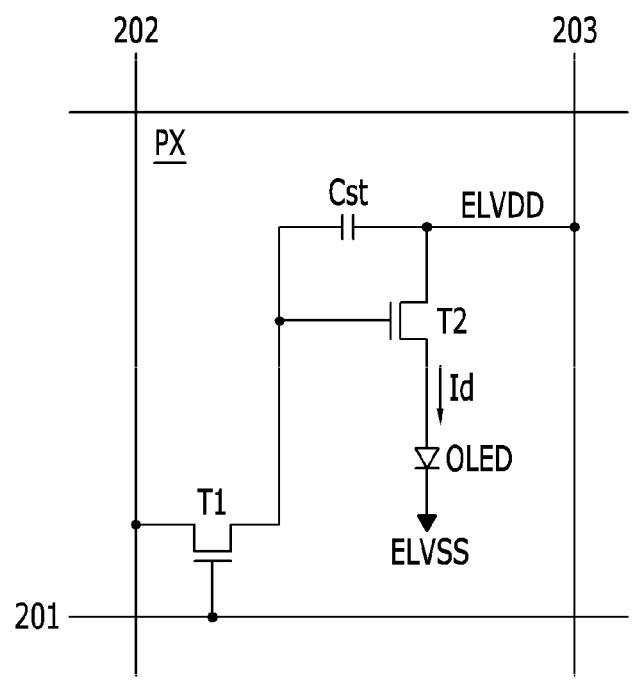
FIG. 10 illustrates an equivalent circuit diagram of a pixel of the flexible display device of FIG. 9.

FIG. 9 illustrates a partially enlarged view of an example of the flexible display device manufactured by the above-described method. FIG. 10 illustrates an equivalent circuit diagram of a pixel of the flexible display device illustrated in FIG. 9. FIGS. 9 and 10 illustrate a case in which the flexible display device is an organic light emitting device as an example. In an implementation, the flexible display device may be configured as a liquid crystal display.

Referring to FIGS. 9 and 10, the organic light emitting device may include a flexible substrate 210 and a plurality of signal lines 201, 202, and 203 and a plurality of pixels PX formed on the flexible substrate 210. The flexible substrate 210 may be configured as any one of the support layer 130 illustrated in FIG. 1 or the flexible substrate 150 illustrated in FIG. 2.

In a display area of the flexible substrate 210, the plurality of signal lines 201, 202, and 203 and the plurality of pixels PX, which are connected to the plurality of signal lines 201, 202, and 203, and arranged substantially in a matrix form, may be formed. The plurality of signal lines may include a scan line 201 for transmitting a scan signal, a data line 202 for transmitting a data signal, and a driving voltage line 203 for transmitting a driving voltage.

The scan line 201 may be substantially parallel with a row direction, and the data line 202 and the driving voltage line 203 may be substantially parallel with a column direction. Each pixel PX may include a switching thin film transistor T1, a driving thin film transistor T2, a storage capacitor Cst, and an organic light emitting diode OLED.

The switching thin film transistor T1 may include a control terminal, an input terminal, and an output terminal. The control terminal may be connected to the scan line 201, the input terminal may be connected to the data line 202, and the output terminal may be connected to the driving thin film transistor T2. The switching thin film transistor T1 may transmit the data signal applied to the data line 202 to the driving thin film transistor in response to the scan signal applied to the scan line 201.

The driving thin film transistor T2 may include a control terminal, an input terminal, and an output terminal. The control terminal may be connected to the switching thin film transistor T1, the input terminal may be connected to the driving voltage line 203, and the output terminal may be connected to the organic light emitting diode OLED. The driving thin film transistor T2 may pass an output current Id of which the magnitude varies depending on a voltage applied between the control terminal and the input terminal flow.

The storage capacitor Cst may be connected to the control terminal and the input terminal of the driving thin film transistor T2 while being therebetween. The storage capacitor Cst may charge the data signal applied to the control terminal of the driving thin film transistor T2 and may maintain the charged data signal even after the switching thin film transistor T1 is turned off.

The organic light emitting diode OLED may include a pixel electrode 211 connected to an output terminal of the driving thin film transistor T2, a common electrode 213 connected to a common voltage ELVSS, and an emission layer 212 positioned between the pixel electrode 211 and the common electrode 213. The organic light emitting diode OLED may emit light of which the intensity varies depending on the output current Id of the driving thin film transistor T2.

In an implementation, a separate thin film transistor and a separate capacitor may be added if desired. Hereinafter, a cross sectional structure of pixels will be described in more detail.

A barrier layer 221 may be formed on the flexible substrate 210. The flexible substrate 210 may be made of, e.g., any one of metal, heat-resistant glass, and quartz glass having a thickness of about 500 μm or less. In an implementation, the flexible substrate 210 may be formed of a plastic film, and an adhesive layer may be positioned between the flexible substrate 210 and the barrier layer 221.

The barrier layer 221 may be formed of, e.g., a single layer of silicon nitride (SiNx) or a multilayer of silicon nitride (SiNx) and silicon oxide ($SiO_2$). The barrier layer 221 may help prevent impurities from permeating through the flexible substrate 210 and planarize a surface.

A semiconductor layer 231 may be formed on the barrier layer 221. The semiconductor layer 231 may be formed of, e.g., polysilicon or oxide semiconductor, and the semiconductor layer 231 formed of the oxide semiconductor may be covered with a separate passivation layer. The semiconductor layer 231 may include a channel region that is not doped with impurities, and a source region and a drain region that are doped with impurities.

A gate insulating layer 222 may be formed on the semiconductor layer 231. The gate insulating layer 222 may be formed of, e.g., a single layer or a stacked layer that is made of silicon nitride (SiNx) or silicon oxide ($SiO_2$). A gate electrode 232 and a first storage capacitor plate 241 may be formed on the gate insulating layer 222. The gate electrode 232 may overlap the channel region of the semiconductor layer 231, and may include, e.g., Au, Ag, Cu, Ni, Pt, Pd, Al, Mo, or the like.

An interlayer insulating layer 223 may be formed on the gate electrode 232 and the first storage capacitor plate 241. The interlayer insulating layer 223 may be formed of, e.g., a single layer or a stacked layer including silicon nitride (SiNx) or silicon oxide ($SiO_2$).

A source electrode 233, a drain electrode 234, and a second storage capacitor plate 242 may be formed on the interlayer insulating layer 223. The source electrode 233 and the drain electrode 234 may be connected to the source region and the drain region of the semiconductor layer 231 through a via hole formed in the interlayer insulating layer 223 and the gate insulating layer 222, respectively. The source electrode 233 and the drain electrode 234 may be formed of, e.g., a metal multilayer such as Mo/Al/Mo or Ti/Al/Ti.

The second storage capacitor plate 242 may overlap the first storage capacitor plate 241. Accordingly, the first and second storage capacitor plates 241 and 242 may constitute a storage capacitor Cst using the interlayer insulating layer 223 as a dielectric material.

FIG. 9 illustrates a top gate type driving thin film transistor T2 as an example. In an implementation, the driving thin film transistor T2 may be covered with a planarization layer 224, and may be connected to the organic light emitting diode OLED to drive the organic light emitting diode OLED.

The planarization layer 224 may be formed of, e.g., a single layer or a stacked layer which is made of an inorganic insulator or an organic insulator. The inorganic insulator may include, e.g., silicon oxide ($SiO_2$), silicon nitride (SiNx), aluminum oxide ($Al_2O_3$), titanium dioxide ($TiO_2$), zirconium dioxide ($ZrO_2$), or the like, and the organic insulator may include, e.g., an acryl-based polymer, an imide-based polymer, polystyrene, or the like.

A pixel electrode 211 may be formed on the planarization layer 224. One pixel electrode 211 may be formed in each pixel, and may be connected to the drain electrode 234 of the driving thin film transistor T2 through a via hole formed in the planarization layer 224. A pixel defining layer 225 may be formed on the planarization layer 224 and an edge of the pixel electrode 211. The pixel defining layer 225 may be made of, e.g., a polyacryl-based resin or a polyimide-based resin and a silica-based inorganic material, or the like.

The emission layer 212 may be formed on the pixel electrode 211, and the common electrode 213 may be formed on the emission layer 212 and the pixel defining layer 225. The common electrode 213 may be formed on the entire display area without distinction among pixels. Any one of the pixel electrode 211 and the common electrode 213 may inject holes to the emission layer 212, and the other one may inject electrons to the emission layer 212.

The emission layer 212 may include an organic emission layer, and may include at least one of a hole injection layer, a hole transport layer, an electron transport layer, and an electron injection layer. When the pixel electrode 211 is an anode for injecting holes, the hole injection layer, the hole transport layer, the organic emission layer, the electron transport layer, and the electron injection layer may be sequentially stacked on the pixel electrode 211. The other layers (except for the organic emission layer) may be formed on the entire display area.

The organic light emitting device may be a top emission type, the pixel electrode 211 may be formed of a reflective layer, and the common electrode 213 may be a transparent layer or a translucent layer. Light emitted from the emission layer 212 may be reflected from the pixel electrode 211, may pass through the common electrode 213, and then may be discharged to the outside. In contrast, when the organic light emitting device is a bottom emission type, pixel electrode 211 may be formed of a transparent layer or a translucent layer, and the common electrode 213 may be formed of a reflective layer.

The reflective layer may include, e.g., Au, Ag, Mg, Al, Pt, Pd, Ni, Nd, Ir, Cr, or the like. The transparent layer may include, e.g., indium tin oxide (ITO), indium zinc oxide (IZO), ZnO, $In_2O_3$, or the like. The translucent layer may be formed of, e.g., a metal thin film including Li, Ca, LiF/Ca, LiF/Al, Al, Ag, Mg, or the like, and the transparent layer made of ITO, IZO, ZnO, $In_2O_3$, or the like may be formed on the translucent layer.

The organic light emitting diode OLED may be sealed by a thin film encapsulation layer 226 including a stacked layer of an inorganic layer and an organic layer. On the thin film encapsulation layer 226, a touch screen panel, a polarization film or a color filter layer, which suppresses reflection of external light, a cover window, which protects a display surface from external impact such as being scratched and pressed, and the like may be formed.

By way of summation and review, a flexible display device may include a bendable flexible substrate such as a plastic film, paper glass, or a metal plate, instead of a hard glass substrate.

The flexible substrate may have an easily bendable characteristic, and thus a thin film transistor process may be performed while the flexible substrate is supported on a hard carrier substrate, and then the carrier substrate may be separated from the flexible substrate.

A sacrificial layer, which facilitates a separation of the flexible substrate and the carrier substrate, may be formed therebetween. However, characteristics of the sacrificial layer may change during a high-temperature heat treatment process during formation of the thin film transistor. In this case, the flexible substrate may not be properly separated from the carrier substrate.

The embodiments may provide a method of manufacturing a flexible display device using a carrier substrate and a sacrificial layer.

The embodiments may provide a method of manufacturing a flexible display device using a carrier substrate and a sacrificial layer capable of easily separating a flexible substrate from the carrier substrate by suppressing a change in characteristics of the sacrificial layer caused by a high-temperature heat treatment process of a thin film transistor.

According to the exemplary embodiments, the sacrificial layer may include a hydrogen trap material. The hydrogen trap material may adsorb hydrogen separated from the amorphous silicon during the high temperature process of forming the thin film transistor, and the hydrogen adsorbed to the hydrogen trap material may later be separated or released from the hydrogen trap material by irradiating a laser to the sacrificial layer.

Accordingly, it is possible for the sacrificial layer to maintain a constant hydrogen concentration, even during the high-temperature heat treatment process of forming the thin film transistor, and to ensure the separation of the support layer from the carrier substrate, thereby reducing and/or preventing a process defect.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a flexible display device, the method comprising:

forming a sacrificial layer on a carrier substrate such that the sacrificial layer includes a hydrogen trap material and amorphous silicon;

forming a support layer and a thin film transistor on the sacrificial layer; and separating the support layer from the carrier substrate by irradiating a laser to the sacrificial layer, wherein:

the sacrificial layer includes a first layer and a second layer, and the hydrogen trap material is included in the first layer.

2. The method as claimed in claim 1, wherein the hydrogen trap material includes a metal that adsorbs hydrogen to form a metal-hydrogen complex or a metal-hydride.

3. The method as claimed in claim 2, wherein the hydrogen trap material includes at least one of platinum (Pt), titanium (Ti), or palladium (Pd).

4. The method as claimed in claim 3, wherein:

the hydrogen trap material adsorbs hydrogen separated from the amorphous silicon during forming of the thin film transistor, and the hydrogen adsorbed onto the hydrogen trap material is separated from the hydrogen trap material during irradiating of the laser to the sacrificial layer.

5. The method as claimed in claim 1, wherein forming the sacrificial layer includes:

depositing the amorphous silicon on the carrier substrate, and diffusing the hydrogen trap material into the amorphous silicon by high-temperature heat treatment.

6. The method as claimed in claim 5, further comprising forming a silicon nitride (SiNx) layer on at least one surface of the sacrificial layer.

7. The method as claimed in claim 1, wherein forming the sacrificial layer includes:

dispersing nanoparticles made of the hydrogen trap material in an amorphous silicon solution, and printing the amorphous silicon solution that includes the dispersed nanoparticles on the carrier substrate.

8. The method as claimed in claim 7, further comprising forming a silicon nitride (SiNx) layer on at least one surface of the sacrificial layer.

9. The method as claimed in claim 1, wherein:

the first layer is formed by a method of printing an amorphous silicon solution, in which nanoparticles made of the hydrogen trap material are dispersed, onto the carrier substrate, and the second layer is formed by a method of depositing the amorphous silicon.

10. The method as claimed in claim 1, wherein forming the sacrificial layer includes:

coating nanoparticles made of the hydrogen trap material onto the carrier substrate, and depositing the amorphous silicon onto the nanoparticles.

11. The method as claimed in claim 1, wherein forming the sacrificial layer includes:

forming the second layer including the amorphous silicon, and forming the first layer on the second layer such that the first layer includes the hydrogen trap material and an insulating material.

12. The method as claimed in claim 11, wherein:

the amorphous silicon of the second layer is formed by deposition, and the first layer is formed by a process of printing nanoparticles made of the hydrogen trap material and then applying the insulating material onto the nanoparticles.

13. The method as claimed in claim 12, wherein the insulating material includes at least one of a silicon oxide (SiO₂) layer or a silicon nitride (SiNx) layer.

14. The method as claimed in claim 1, wherein the support layer is a flexible substrate.

15. The method as claimed in claim 1, wherein:
the support layer is a barrier layer, and
the method further includes bonding a flexible substrate to the support layer after the support layer is separated from the carrier substrate.

* * * * *